(12) United States Patent
Chen

(10) Patent No.: US 12,040,218 B2
(45) Date of Patent: Jul. 16, 2024

(54) METHOD OF FORMING A SEMICONDUCTOR DEVICE

(71) Applicant: Winbond Electronics Corp., Taichung (TW)

(72) Inventor: Frederick Chen, Tainan (TW)

(73) Assignee: WINBOND ELECTRONICS CORP., Taichung (TW)

( * ) Notice: Subject to any disclaimer, the term of this patent is extended or adjusted under 35 U.S.C. 154(b) by 179 days.

(21) Appl. No.: 17/371,605

(22) Filed: Jul. 9, 2021

(65) Prior Publication Data

US 2023/0008819 A1 Jan. 12, 2023

(51) Int. Cl.
*H01L 21/76* (2006.01)
*H01L 21/033* (2006.01)
*H01L 21/762* (2006.01)
*H10B 12/00* (2023.01)

(52) U.S. Cl.
CPC .... *H01L 21/76224* (2013.01); *H01L 21/0337* (2013.01); *H10B 12/0335* (2023.02); *H10B 12/0387* (2023.02); *H10B 12/31* (2023.02); *H10B 12/34* (2023.02)

(58) Field of Classification Search
CPC ........... H01L 21/76224; H01L 21/0337; H01L 21/3086; H10B 12/0335; H10B 12/0387; H10B 12/31; H10B 12/34
See application file for complete search history.

(56) References Cited

U.S. PATENT DOCUMENTS

| 5,877,522 | A | 3/1999 | Kasai | |
|---|---|---|---|---|
| 10,714,357 | B2 | 7/2020 | Hung et al. | |
| 2012/0220125 | A1* | 8/2012 | Yi | H10B 12/0335 257/E21.586 |
| 2019/0139964 | A1* | 5/2019 | Varghese | H10B 12/36 |
| 2019/0172719 | A1* | 6/2019 | Lupo | H01L 21/3086 |
| 2021/0343537 | A1* | 11/2021 | Ping | H01L 21/3086 |
| 2021/0375869 | A1* | 12/2021 | Zhang | H01L 21/3086 |

* cited by examiner

*Primary Examiner* — Shouxiang Hu
(74) *Attorney, Agent, or Firm* — Muncy, Geissler, Olds & Lowe, P.C.

(57) ABSTRACT

A method of forming semiconductor device, including forming a first protective strip and a second protective strip on a semiconductor substrate. The first protective strip and the second protective strip extend in a first direction and are alternately arranged in a second direction perpendicular to the first direction. The first protective strip and the second protective strip are spaced apart from each other. The first protective strip is cut by selectively removing a portion of the first protective strip. The second protective strip is cut by selectively removing a portion of the second protective strip. The semiconductor substrate is etched to form an isolation trench. Remaining portions of the first and second protective strips are removed. An isolation feature is filled into the isolation trench. The isolation feature defines a plurality of strip-shaped active regions. Capacitor contacts are formed on both ends of each of the strip-shaped active regions.

13 Claims, 10 Drawing Sheets

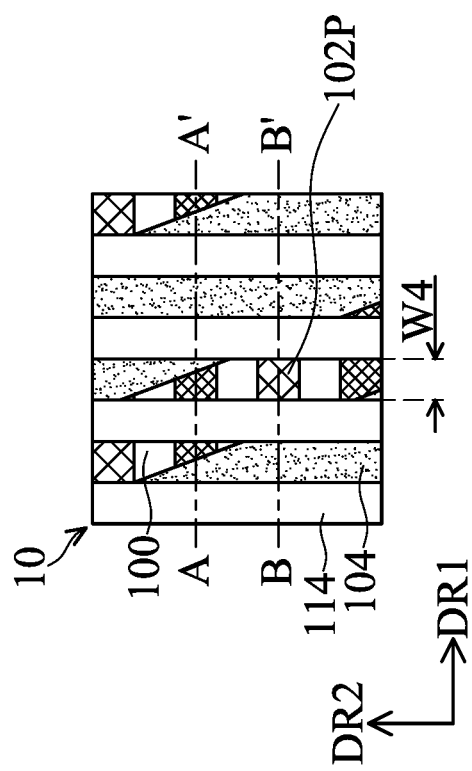
FIG. 8A
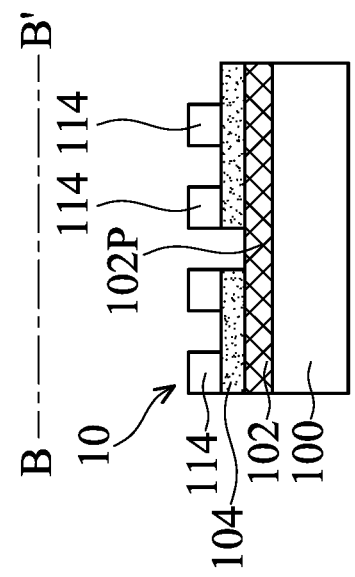
FIG. 8C
FIG. 8B

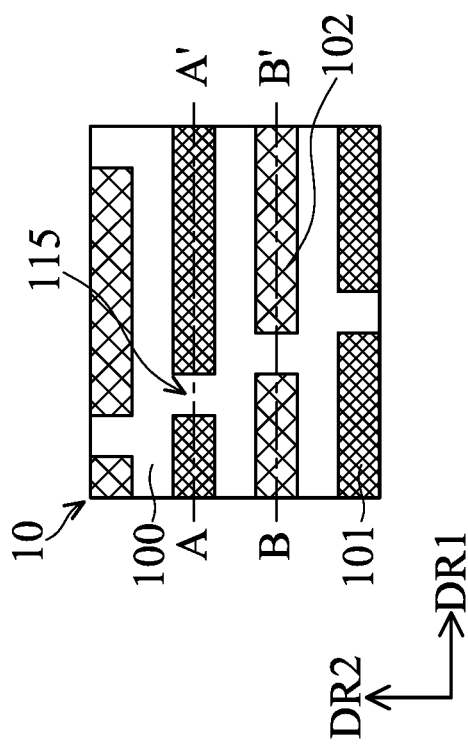
FIG. 10A
FIG. 10C
FIG. 10B

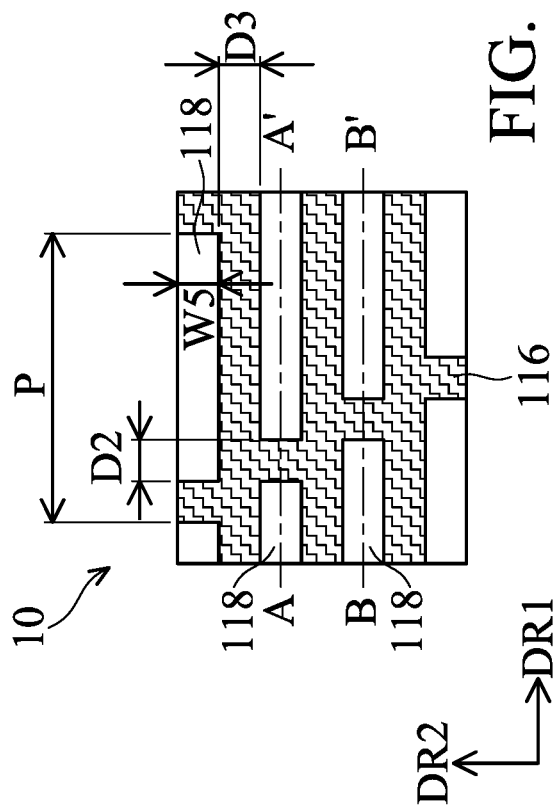
FIG. 11A
FIG. 11B
FIG. 11C

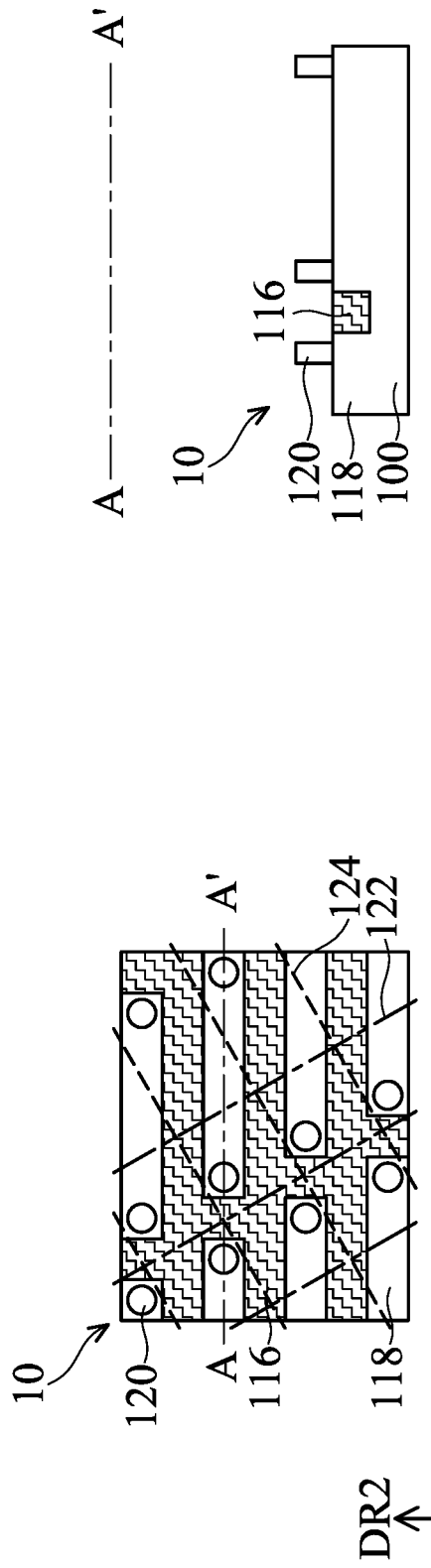
FIG. 12B
FIG. 12A
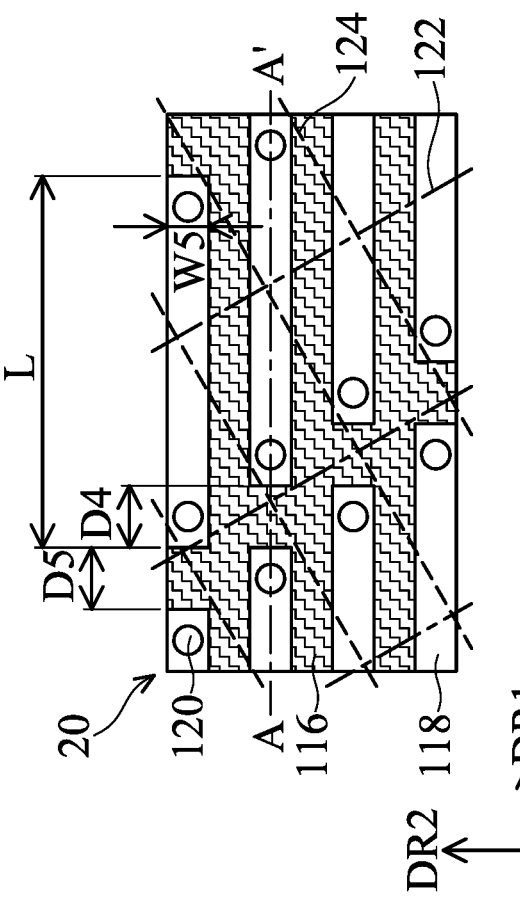
FIG. 13

METHOD OF FORMING A SEMICONDUCTOR DEVICE

BACKGROUND

Field of the Disclosure

The present disclosure relates to a semiconductor device, and in particular, to a memory device and a method of forming the same.

Description of the Related Art

Semiconductor devices are applied to many industries, such as automobile manufacturing, communications, computers, and consumer electronics. The ongoing development of these semiconductor devices has seen their dimensions reduced even as functional density is increased. This scaling-down process generally provides benefits by increasing production efficiency and device performance. However, such scaling down has also been accompanied by some issues, such as increased complexity in manufacture of devices, or, sometimes, a higher cost of processing. For example, semiconductor devices with decreased dimensions may provide less space for features therein, resulting in unwanted contact between or among the features. Although existing semiconductor devices and methods of forming the same have been generally adequate for their intended purposes, they have not been entirely satisfactory in all respects.

SUMMARY

Some embodiments of the present disclosure provide a method of forming a semiconductor device, which includes the following steps. A first protective strip and a second protective strip are formed on a semiconductor substrate, wherein the first protective strip and the second protective strip extend in a first direction and are alternately arranged in a second direction. The second direction is perpendicular to the first direction. The first protective strip and the second protective strip are spaced apart from each other. The first protective strip is cut by selectively removing a portion of the first protective strip. The second protective strip is cut by selectively removing a portion of the second protective strip. The semiconductor substrate is etched to form an isolation trench. Remaining portions of the first protective strip and the second protective strip are used as an etch mask. The remaining portions of first protective strip and the second protective strip are removed. An isolation feature is filled into the isolation trench. The isolation feature defines a plurality of strip-shaped active regions. Capacitor contacts are formed on both ends of each of the strip-shaped active regions.

Some embodiments of the present disclosure provide a semiconductor device, which includes a semiconductor substrate, an isolation feature, a plurality of strip-shaped active regions, and capacitor contacts. The isolation feature is disposed on the semiconductor substrate. The strip-shaped active regions are defined by the isolation feature. The column position of an edge of each of the strip-shaped active regions in one row is laterally shifted by a shift distance relative to a column position of a respective edge of each of the strip-shaped active regions in an adjacent row. The shift distance is one to two times the width of the strip-shaped active regions. The capacitor contacts on both ends of each of the strip-shaped active regions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1, 2A, 5A-12A illustrate schematic top views of a semiconductor device, in accordance with some embodiments of the present disclosure.

FIGS. 2B-12B illustrate schematic cross-sectional views of a semiconductor device during fabrication processes, in accordance with some embodiments of the present disclosure.

FIGS. 2C, 5C, 7C, 8C, 10C, and 11C illustrate schematic cross-sectional views of a semiconductor device during fabrication processes, in accordance with some embodiments of the present disclosure.

FIG. 13 illustrates a schematic top view of a semiconductor device during fabrication processes, in accordance with some variations of some embodiments of the present disclosure.

DETAILED DESCRIPTION OF THE DISCLOSURE

Figure 2A:
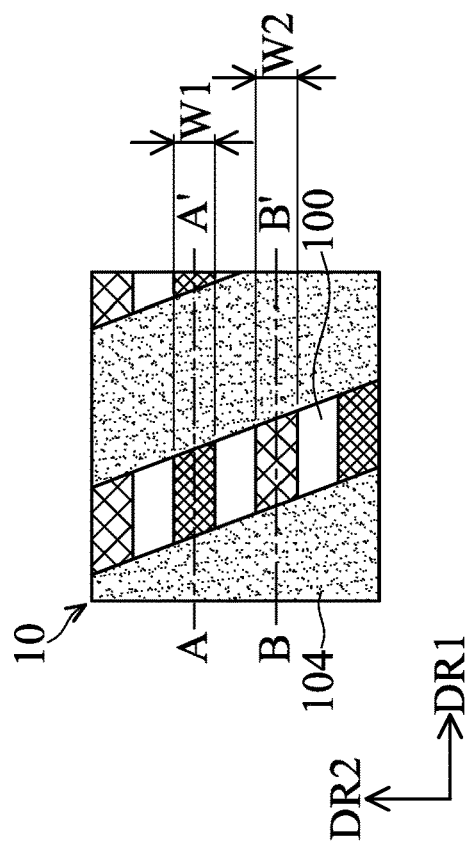

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Additionally, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise. In addition, the term "coupled" include any method of direct and indirect electrical connection.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "roughly" typically mean ±20% of the stated value, or ±10% of the stated value, or ±5% of the stated value, or ±3% of the stated value, or ±2% of the stated value, or ±1% of the stated value, or ±0.5% of the stated value. The stated value of the present disclosure is an approximate value. When there is no specific description, the stated value includes the meaning of "about", "approximately", and "roughly". The terminology used herein is for the purpose of describing particular embodiments only and is not intended to limit the invention. As used herein, the singular terms "a," "an" and "the" are intended to include the plural forms as well, unless the context clearly indicates otherwise.

Some embodiments of the disclosure are described below. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

In accordance with some embodiments of the present disclosure, during fabrication processes of a semiconductor device, a first protective strip and a second protective strip are formed on a semiconductor substrate, and the first protective strip and the second protective strip are cut. The semiconductor substrate is etched to form an isolation trench, while the first protective strip and the second protective strip are used as an etch mask. An isolation feature is subsequently formed in the isolation trench to define a plurality of strip-shaped active regions. The strip-shaped active regions are configured to provide sufficient area for subsequently formed features such as capacitor contacts, word lines, bit lines, or other features, thereby reducing impact of overlay.

Figure 1:
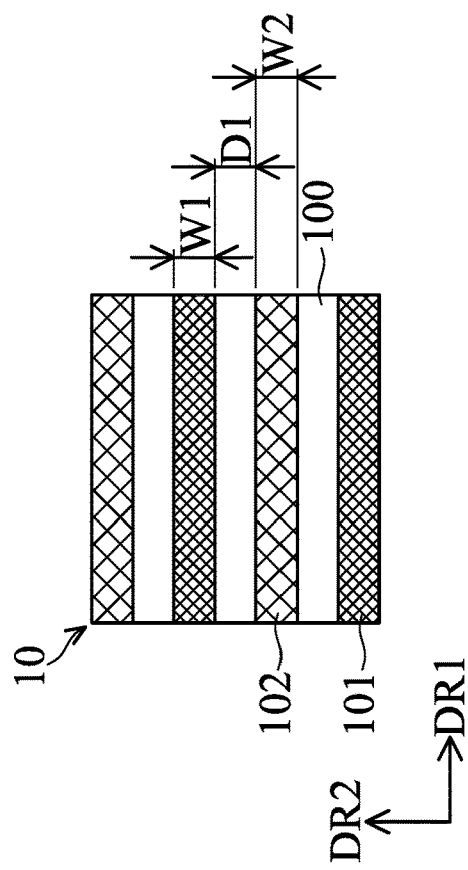

Refer to FIG. 1, a schematic top view of a semiconductor device 10 is illustrated in accordance with some embodiments of the present disclosure. A first protective strip 101 and a second protective strip 102 are formed on a semiconductor substrate 100. In some embodiments, the substrate 100 may include: a semiconductor substrate, such as a silicon substrate; an elemental semiconductor including germanium; a compound semiconductor including gallium nitride (GaN), silicon carbide, gallium arsenide, gallium phosphide, indium phosphide, indium arsenide and/or indium antimonide. In other embodiments, the substrate 100 may be a semiconductor on insulator substrate (SOI). The first protective strip 101 and the second protective strip 102 both extend in a first direction DR1 and are alternately arranged in a second direction DR2 perpendicular to the first direction DR1, and the first protective strip 101 and the second protective strip 102 are spaced apart from each other by a distance of D1. In the second direction DR2, the first protective strip 101 has a width of W1 and the second protective strip 102 has a width of W2. In some embodiments, the first protective strip 101 and the second protective strip 102 have the same width in the second direction DR2 (i.e. the width W1 is equal to the width W2). In some embodiments, the distance D1 between the first protective strip 101 and second protective strip 102 is equal to the width of each of the first protective strip 101 and second protective strip 102 in the second direction DR2 (i.e. D1, W1, and W2 are equal). The material of the first protective strip 101 and the second protective strip 102 may include oxide, nitride, oxynitride, carbide, and so on. For example, the material of the protective strips may be SiO, SiN, SiON, SiC, the like, or a combination thereof. In some embodiments, the material of the first protective strip 101 is different from the material of the second protective strip 102. In such embodiments, the method of forming the first protective strip 101 and the second protective strip 102 includes depositing and patterning a material layer for the first protective strip 101, and depositing the second protective strip 102 after forming the spacers 100 on the sidewalls of the first protective strip 101. Examples of deposition processes include a chemical vapor deposition (CVD) process, a flowable CVD (FCVD) process, a physical vapor deposition (PVD) process, an atomic layer deposition (ALD) process, or combinations thereof.

Figure 2C:
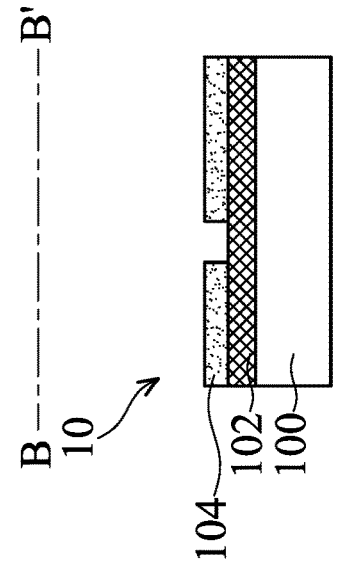
Figure 2B:
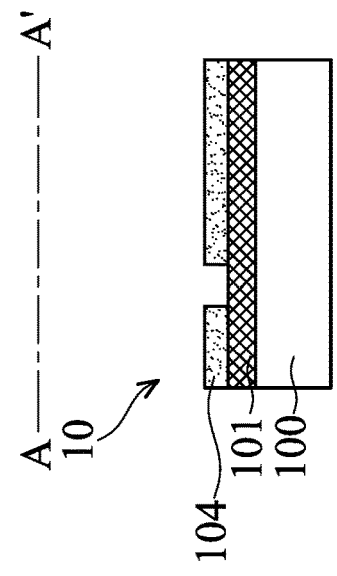

Next, the first protective strip 101 is cut by selectively removing a portion 101P of the first protective strip 101. The steps of cutting the first protective strip 101 are described below with reference to FIGS. 2A-2C, 3A-3B, 4A-4B, 5A-5B, and 6A-6B. For simplicity and clarity, some features and/or some portions of the features may not be shown in the figures. Refer to FIGS. 2A-2C, where FIG. 2A illustrates a schematic top view of the semiconductor device 10 and FIGS. 2B and 2C illustrate cross-sectional views of the semiconductor device 10 along the cross sections A-A' and B-B' in FIG. 2A respectively, a keep zone layer 104 is formed on the first protective strip 101, the second protective strip 102, and the semiconductor substrate 100. The keep zone layer 104 partially exposes the first protective strip 101 and the second protective strip 102. The material of the keep zone layer 104 may include amorphous carbon, oxide, nitride, oxynitride, carbide, and so on. According to some embodiments of the present disclosure, the material of the keep zone layer 104 is different from those of the first protective strip 101 and the second protective strip 102.

Figure 3A:
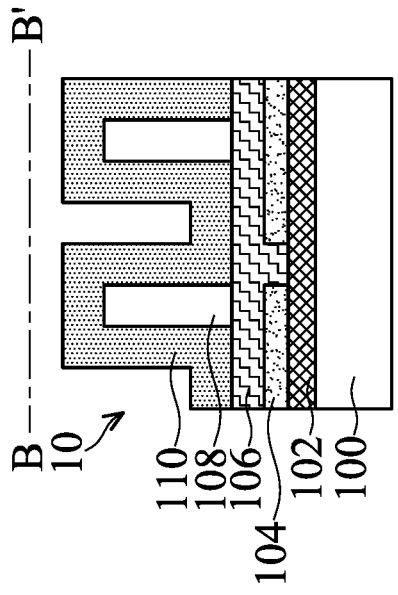
FIGS. 3A and 4A illustrate schematic cross-sectional views of a semiconductor device during fabrication processes, in accordance with some embodiments of the present disclosure.
Figure 3B:
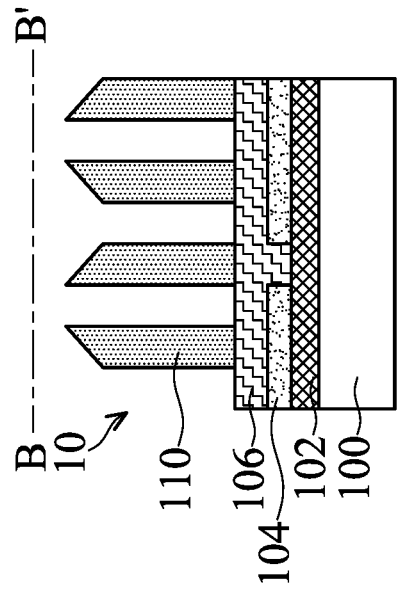

Refer to FIGS. 3A-3B, which illustrate cross-sectional views of the semiconductor device 10 along the cross sections A-A' and B-B' in FIG. 2A respectively, a fill mask layer 106 is formed on the keep zone layer 104, the first protective strip 101, and the second protective strip 102. The material of the fill mask layer 106 is different from that of the keep zone layer 104 and may include oxide, nitride, oxynitride, carbide, metal, and so on. The fill mask layer 106 may be formed by depositing a material layer on the keep zone layer 104, first protective strip 101, and second protective strip 102, optionally followed by a planarization process such as chemical mechanical polishing (CMP) or etch back process on the material layer. In some embodiments, the process of depositing the material layer for the fill mask layer 106 may include CVD, FCVD, PVD, ALD, or a combination thereof.

Still referring to FIGS. 3A and 3B, a patterned resist layer 108 is formed on the fill mask layer 106. In some embodiments, the patterned resist layer 108 may be a patterned photoresist layer, and may be formed by performing a deposition process to deposit a photoresist layer on the fill mask layer 106 and patterning the photoresist layer in one or more photolithography processes. According to some embodiments of the present disclosure, a portion of the patterned resist layer 108 is directly above the exposed first protective strip 101, as shown in FIG. 3A. In some embodiments, there is a lateral offset between the portion of the patterned resist layer 108 and the exposed second protective strip 102, as shown in FIG. 3B. In other words, the projection of the portion of the patterned resist layer 108 overlaps the projection of the exposed first protective strip 101. In some embodiments, the photolithography process may include forming a resist layer (or photoresist layer) overlying the substrate, exposing the resist to a pattern, performing post-exposure bake processes, and developing the resist to form a patterned resist layer. The deposition process of the patterned resist layer 108 may include a spin coating process. A conformal spacer layer 110 is then formed on the fill mask layer 106 and the patterned resist layer 108. The material of the spacer layer 110 may include oxide, nitride, amorphous carbon, or the like, and may be formed by CVD, PVD, ALD, or a combination thereof.

Figure 4A:
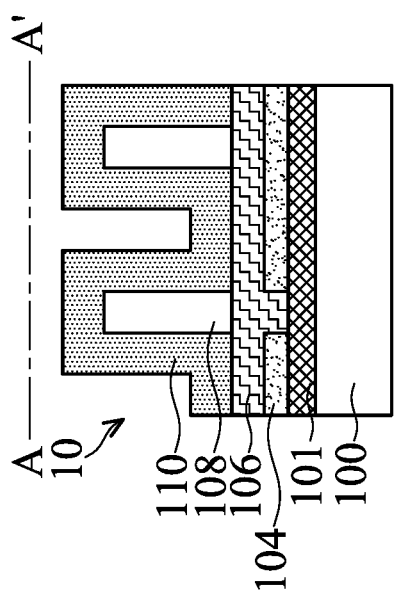
Figure 4B:
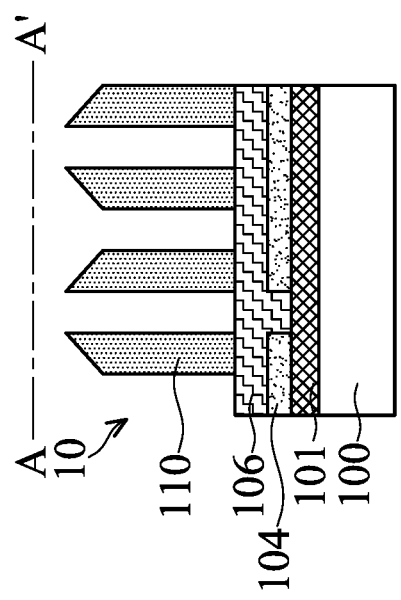

Refer to FIGS. 4A-4B, which illustrate cross-sectional views of the semiconductor device 10 along the cross sections A-A' and B-B' in FIG. 2A respectively, the conformal spacer layer 110 is anisotropically etched to form the spacers 110 on sidewalls of the patterned resist layer 108. According to some embodiments of the present disclosure, one of the spacers 110 is directly above the exposed second protective strip 102. In other words, the projection of the spacers 110 overlaps the projection of the exposed second protective strip 102. After the spacers 110 are formed, the patterned resist layer 108 is removed by, for example, strip process, ash process, suitable removal process, or the combination thereof.

Figure 5C:
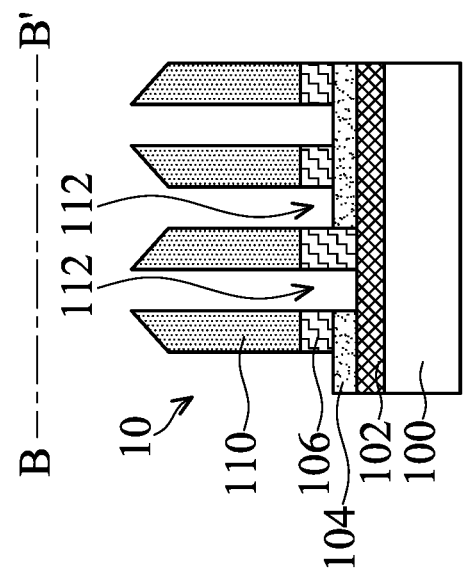
Figure 5A:
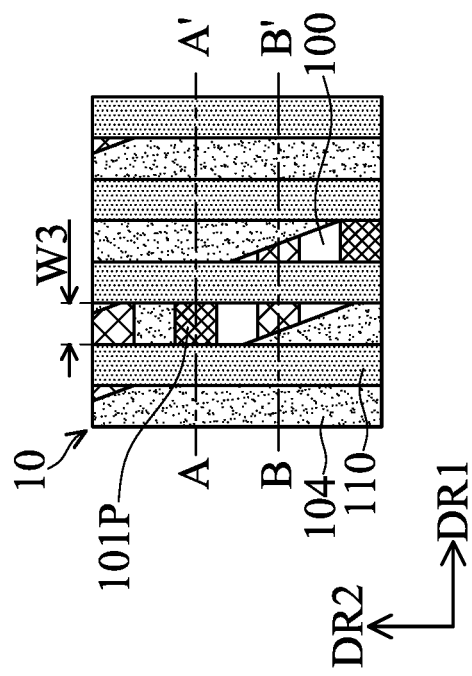
Figure 5B:
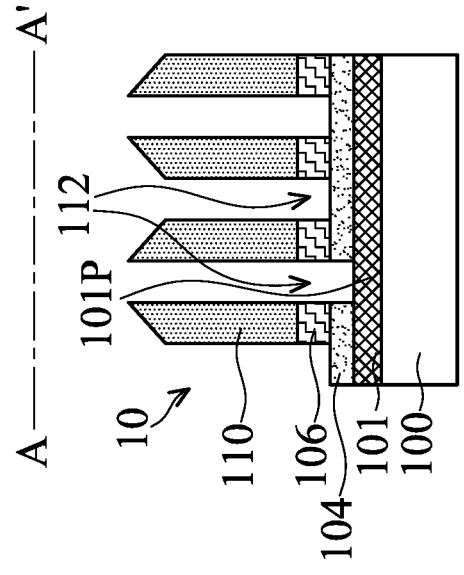

Refer to FIGS. 5A-5C, where FIG. 5A illustrates a schematic top view of the semiconductor device 10 and FIGS. 5B and 5C illustrate cross-sectional views of the semiconductor device 10 along the cross sections A-A' and B-B' in FIG. 5A respectively, the pattern of the spacers 110 is transferred to the fill mask layer 106. More specifically, the fill mask layer 106 exposed by the spacers 110 is etched to form recesses 112, as shown in FIGS. 5B and 5C. The portion 101P of the first protective strip 101 is exposed by one of the recesses 112 after the fill mask layer 106 is etched. According to some embodiments of the present disclosure, the fill mask layer 106 is etched by an etching process selective to the fill mask layer 106, and thus other features, such as the portion 101P of the first protective strip 101, the keep zone layer 104, the spacers 110 are not attacked by the etching. The process described above may be referred to as self-aligned double patterning (SADP) process, where spacers are formed on sidewalls of a patterned resist layer (or sacrificial layer) and then the patterned resist layer is removed, and the remaining spacers can be used as an etch mask to pattern other features.

Figure 6B:
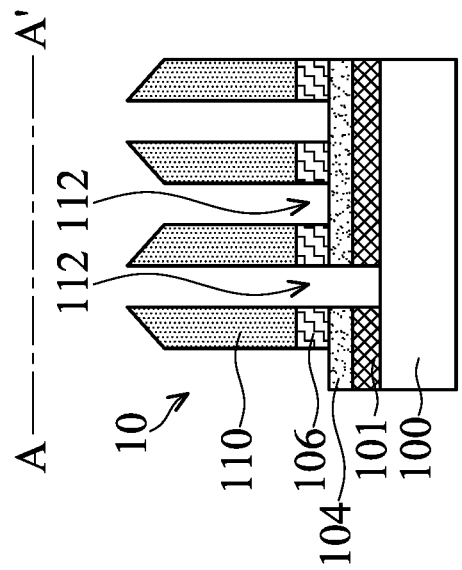
Figure 6A:
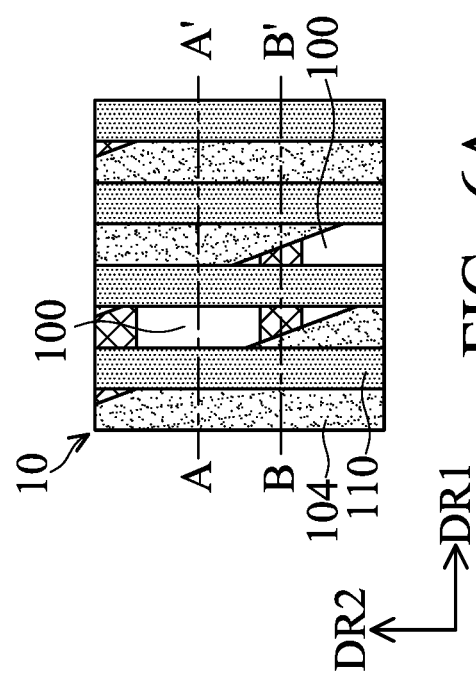

Refer to FIGS. 6A and 6B, where FIG. 6A illustrates a schematic top view of the semiconductor device 10 and FIG. 6B illustrates a cross-sectional view of the semiconductor device 10 along the cross sections A-A' in FIG. 6A, the exposed portion 101P of the first protective strip 101 is selectively etched and thereby removed. According to some embodiments of the present disclosure, due to the selective etching to the exposed portion 101P of the first protective strip 101, other features, such as the keep zone layer 104 and the spacers 110 are not attacked by the etching. Therefore, the cross-sectional view of the semiconductor device 10 along the cross sections B-B' in FIG. 6A remains the same as FIG. 5C. The spacers 110 are subsequently removed.

Figure 7A:
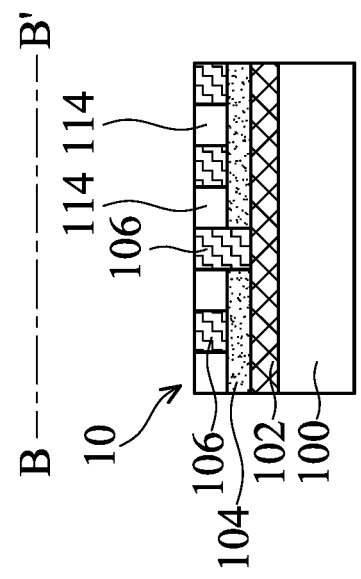
Figure 7B:
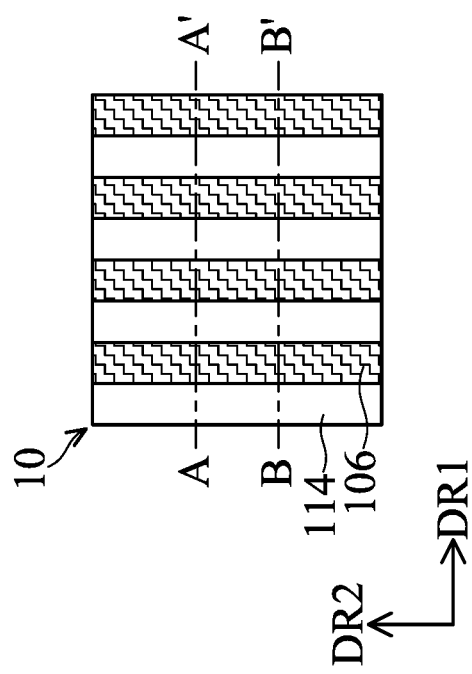
Figure 7C:
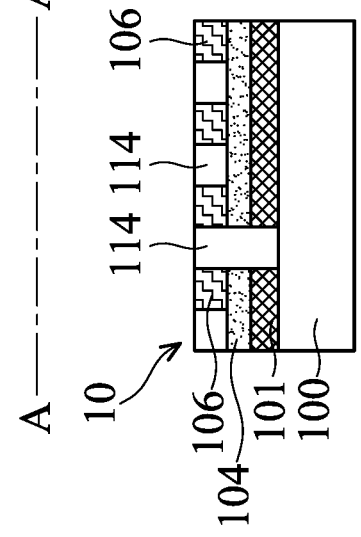

Next, the second protective strip 102 is cut by selectively removing the portion 102P of the second protective strip 102. The steps for cutting the second protective strip 102 are described below with reference to FIGS. 7A-7C, 8A-8C, and 9A-9B. For simplicity and clarity, some features and/or some portions of the features may not be shown in the figures. Referring to FIGS. 7A-7C, where FIG. 7A illustrates a schematic top view of the semiconductor device 10 and FIGS. 7B and 7C illustrate cross-sectional views of the semiconductor device 10 along the cross sections A-A' and B-B' in FIG. 7A respectively, a tone inversion layer 114 is filled in the recesses 112. The tone inversion layer 114 may be formed by depositing a tone inversion material layer in the recesses 112 and performing a planarization process such as chemical mechanical polishing (CMP) process to remove excess tone inversion material layer outside the recesses 112. According to some embodiments of the present disclosure, the material of the tone inversion layer 114 is different from the material of the fill mask layer 106 and may include oxide, nitride, oxynitride, carbide, and so on.

Refer to FIGS. 8A-8C, where FIG. 8A illustrates a schematic top view of the semiconductor device 10 and FIGS. 8B and 8C illustrate cross-sectional views of the semiconductor device 10 along the cross sections A-A' and B-B' respectively in FIG. 8A, the fill mask layer 106 is removed such that the portion 102P of the second protective strip 102 is exposed. In some embodiments, the fill mask layer 106 may be removed by an etching process with selectivity to the fill mask layer 106, such as wet etching, dry etching, reactive ion etching (RIE), and/or other suitable processes. In some embodiments of the present disclosure, an etching process is selective to or with selectivity to one feature (or layer) means the etch rate ratio of the feature (or layer) to other features is much greater than one (e.g., three or higher).

Refer to FIGS. 5A and 8A, in the first direction DR1, the portion 101P of the first protective strip 101 has a width of W3 and the portion 102P of the second protective strip 102 has a width of W4. In some embodiments, the width W3 of the portion 101P of the first protective strip 101 in the first direction DR1 is one to two times the width W1 of the first protective strip 101 in the second direction DR2. In some embodiments, the width W4 of the portion 102P of the second protective strip 102 in the first direction DR1 is one to two times the width W2 of the second protective strip 102 in the second direction DR2. In some embodiments, the portion 101P of the first protective strip 101 and the portion 102P of the second protective strip 102 have the same width in the first direction DR1 (i.e. the width W3 is equal to the width W4).

Figure 9B:
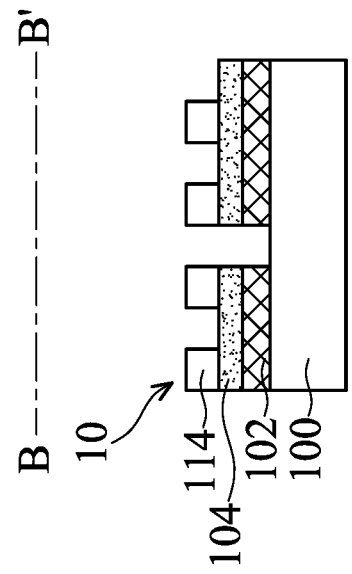
Figure 9A:
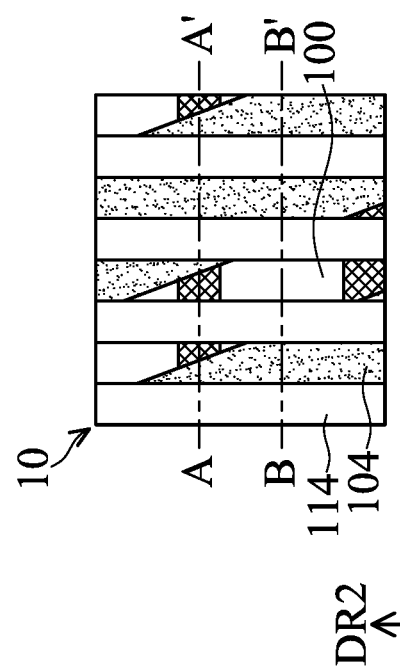

Refer to FIGS. 9A and 9B, where FIG. 9A illustrates a schematic top view of the semiconductor device 10 and FIG. 9B illustrates a cross-sectional view of the semiconductor device 10 along the cross sections B-B' in FIG. 9A, the exposed portion 102P of the second protective strip 102 is selectively etched and thereby removed. According to some embodiments of the present disclosure, due to the selective etching to the exposed portion 102P of the second protective strip 102, other features, such as the keep zone layer 104 and the tone inversion layer 114 are not attacked by the etching. In other words, the keep zone layer 104 and the tone inversion layer 114 are used as an etch mask that protects the other portion of the second protective strip 102. Therefore, the cross-sectional view of the semiconductor device 10 along the cross sections A-A' in FIG. 9A remains the same as FIG. 8B. The tone inversion layer 114 and the keep zone layer 104 are subsequently removed. Similar to the SADP process described above, in some embodiments of the present disclosure, the process discussed herein with reference to FIGS. 7A-7C, 8A-8C, and 9A-9B can also be referred to as a SADP process, where the tone inversion layer 114 may be considered to be formed on sidewalls of the fill mask layer 106 and then the fill mask layer 106 is removed, and the remaining tone inversion layer 114 (along with the keep zone layer 104) can be used as an etch mask to pattern other features. However, the pattern of the tone inversion layer 114 may not be completely transferred in some embodiments. According to some embodiments of the present disclosure, by adopting the SADP processes discussed above, the number of masks (or photomasks) used during processes can be reduced, and thereby the processing cost is reduced.

Next, referring to FIGS. 10A-10C, where FIG. 10A illustrates a schematic top view of the semiconductor device 10 and FIGS. 10B and 10C illustrate cross-sectional views of the semiconductor device 10 along the cross sections A-A' and B-B' in FIG. 10A respectively, the semiconductor substrate 100 is etched to form an isolation trench 115 by using remaining portions of the first protective strip 101 and the second protective strip 102 as an etch mask. In some embodiments, the semiconductor substrate 100 may be etched by reactive ion etching (RIE), and/or other etching methods. The remaining portions of first protective strip 101 and the second protective strip 102 are subsequently removed in a removal process, such as strip process, ash process, another suitable removal process, or a combination thereof.

Refer to FIGS. 11A-11C, where FIG. 11A illustrates a schematic top view of the semiconductor device 10 and FIGS. 11B and 11C illustrate cross-sectional views of the semiconductor device 10 along the cross sections A-A' and B-B' in FIG. 11A respectively, an isolation feature 116 is filled in the isolation trench 115 and defines a plurality of strip-shaped active regions 118. The isolation feature 116 may be formed by depositing an isolation material layer on the semiconductor substrate 100 and performing a planarization process to remove excess isolation material layer outside the isolation trench 115. In some embodiments, the material of the isolation feature 116 may be a dielectric material (e.g. a semiconductor oxide, a semiconductor nitride, a semiconductor oxynitride, a semiconductor carbide), fluoride-doped silicate glass (FSG), phosphosilicate glass (PSG), borophosphosilicate glass (BPSG), amorphous fluorinated carbon, parylene, or a combination thereof. In some embodiments, before the formation of the isolation feature 116, a liner layer (not shown) may be conformally formed in the isolation trench 115. The material of the liner layer is different from the isolation feature 116 and may include oxide, nitride, oxynitride, and/or another suitable material.

In some embodiments, a column position of an edge of each of the strip-shaped active regions 118 in one row is laterally shifted by a shift distance D2 relative to a column position of a respective edge of each of the respective strip-shaped active region 118 in an adjacent row. As shown in FIG. 11A, the distance between strip-shaped active regions 118 in adjacent rows is D3. The strip-shaped active regions 118 have a width of W5 in the second direction DR2, and they have a pitch P in each row in the first direction DR1. In some embodiments, the shift distance D2 is one to two times the width W5 of the strip-shaped active regions 118. In some embodiments, the distance D3 between strip-shaped active regions 118 in adjacent rows is equal to the width W5 of the strip-shaped active regions 118. In some embodiments, the pitch P of the strip-shaped active regions 118 in each row is six times the shift distance D2. In some embodiments, the pitch P of the strip-shaped active regions 118 in each row is eight to nine times the width W5 of the strip-shaped active regions 118. One or more of the configurations of the strip-shaped active regions 118 may provide sufficient area for subsequently formed features. For example, enough clearance for latter formed capacitor contacts may be provided in some embodiments of the present disclosure. Furthermore, additional components may be formed on the semiconductor in some subsequent processes, and the configurations discussed herein may provide spatial flexibility for those components. Accordingly, the impact of the overlay may be reduced and the process or design margin may be increased.

Refer to FIGS. 12A and 12B, where FIG. 12A illustrates a schematic top view of the semiconductor device 10 and FIG. 12B illustrates a cross-sectional view of the semiconductor device 10 along the cross sections A-A' in FIG. 12A, capacitor contacts 120 are formed on both ends of each of the strip-shaped active regions 118. The capacitor contacts 120 may include metals, such as TiN, Cu, W, Al, or a combination thereof. In some embodiments, the capacitor contacts 120 may include doped polycrystalline silicon. In some embodiments, the capacitor contact landing area is defined as the shift distance described above times the width of the strip-shaped active regions (That is, D2*W5 of the embodiments shown in FIG. 11A), and the cell area is defined as the pitch of the strip-shaped active regions 118 in each row times the width of the strip-shaped active regions (That is, P*(W5+D3) of the embodiments shown in FIG. 11A). In such embodiments, the capacitor contact landing area may be one to two times the square of the width of the strip-shaped active regions 118; the cell area may be eight to nine times the square of the width of the strip-shaped active regions 118, equals to about 8.484*W5^2. The illustrated capacitor contacts 120 in FIGS. 12A and 12B is merely one possible way for arranging the capacitor contacts 120, while other ways are also feasible. In FIG. 12A, bit lines 122 and word lines 124 are schematically illustrated. As discussed above, one or more of the embodiments of the present disclosure provide sufficient area for features (e.g. capacitor contacts, bit lines, word lines, or other features) in the semiconductor. This may prevent bit lines or word lines from coming into contact with capacitor contacts as well as avoiding rowhammer.

Embodiments of the present disclosure can be modified and/or combined. For example, referring to FIG. 13, a schematic top view of a semiconductor device 20, the ratio of the shift distance D4 to the width W5 of the strip-shaped active regions 118 (i.e. D4/W5) of semiconductor device 20 is different from the ratio of the shift distance D2 to the width W5 of the strip-shaped active regions 118 (i.e. D2/W5) of semiconductor device 10. However, both the ratios are within the scope of the present disclosure, which is between one and two. The semiconductor device 20 includes the semiconductor substrate 100, the isolation feature 116 on the semiconductor substrate 100, a plurality of strip-shaped active regions 118 defined by the isolation feature 116, and capacitor contacts 120. The column position of the edge of each of the strip-shaped active regions 118 in one row is laterally shifted by a shift distance D4 relative to the column position of the respective edge of each of the strip-shaped active regions 118 in an adjacent row and the shift distance D4 is one to two times the width W5 of the strip-shaped active regions 118. The capacitor contacts 120 are located on both ends of each of the strip-shaped active regions 118. In some embodiments, the distance D5 between adjacent strip-shaped active regions 118 in the first direction DR1 is one to two times the width W5 of the strip-shaped active regions 118. In some embodiments, in the second direction DR2, an edge of one strip-shaped active region 118 in one row is aligned with an edge of another strip-shaped active region 118 in an adjacent row. In other embodiments, the length L of the strip-shaped active regions 118 is six to eight times the width W5 of the strip-shaped active regions 118. For example, the length L may be seven times the width W5.

The embodiments of the present disclosure provide many benefits to a semiconductor device and the formation thereof. In some embodiments of the present disclosure, the cost of forming the semiconductor can be reduced by using the two SADP processes. Furthermore, according to some embodiments of the present disclosure, the semiconductor device is configured to provide sufficient area for features to be subsequently formed thereon, and the impact of the overlay is reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a plurality of first protective strips and a plurality of second protective strips on a semiconductor substrate, wherein the first protective strips and the second protective strips extend in a first direction and are alternately arranged in a second direction perpendicular to the first direction, and the first protective strips and the second protective strips are spaced apart from each other;
    cutting the first protective strips by selectively removing a portion of the first protective strips, comprising:
        forming a keep zone layer on the first protective strips, the second protective strips, and the semiconductor substrate, wherein the keep zone layer partially exposes the first protective strips and the second protective strips;
        forming a fill mask layer on the keep zone layer, the first protective strips, and the second protective strips;
        forming spacers on the fill mask layer;
        etching the fill mask layer exposed by the spacers to form recesses in the fill mask layer and in the keep zone layer, wherein the recesses in the keep zone layer expose the portion of the first protective strips;
        selectively etching the exposed portion of the first protective strips; and
        removing the spacers;
    cutting the second protective strips by selectively removing a portion of the second protective strips;
    etching the semiconductor substrate to form an isolation trench, wherein remaining portions of the first protective strips and the second protective strips are used as an etch mask;
    removing the remaining portions of the first protective strips and the second protective strips;
    filling an isolation feature in the isolation trench, wherein the isolation feature defines a plurality of strip-shaped active regions and surrounds each of the plurality of active regions, and a column position of an edge of each of the strip-shaped active regions in one row is laterally shifted by a shift distance relative to a column position of a respective edge of each of the active regions in an adjacent row; and
    forming capacitor contacts on both ends of each of the active regions.

2. The method as claimed in claim 1, wherein cutting the second protective strips by selectively removing the portion of the second protective strips comprises:
    filling a tone inversion layer in the recesses;
    removing the fill mask layer to expose the portion of the second protective strips;
    selectively etching the exposed portion of the second protective strips; and
    removing the tone inversion layer and the keep zone layer.

3. The method as claimed in claim 1, wherein forming the spacers on the fill mask layer comprises:
    forming a patterned resist layer on the fill mask layer;
    forming a conformal spacer layer on the fill mask layer and the patterned resist layer;
    anisotropically etching the conformal spacer layer to form the spacers on sidewalls of the patterned resist layer; and
    removing the patterned resist layer.

4. The method as claimed in claim 1, wherein a width of the portion of the first protective strips in the first direction is one to two times a width of the first protective strips in the second direction.

5. The method as claimed in claim 1, wherein a width of the portion of the second protective strips in the first direction is one to two times a width of the second protective strips in the second direction.

6. The method as claimed in claim 1, wherein the portion of the first protective strips and the portion of the second protective strips have a same width in the first direction.

7. The method as claimed in claim 1, wherein the first protective strips and the second protective strips have a same width in the second direction.

8. The method as claimed in claim 1, wherein a distance between the first protective strips and second protective strips is equal to a width of each of the first protective strips and the second protective strips in the second direction.

9. The method as claimed in claim 1, wherein the first protective strips and the second protective strips comprise different materials.

10. The method as claimed in claim 1, wherein the shift distance is one to two times a width of the strip-shaped active regions.

11. The method as claimed in claim 1, wherein a distance between the strip-shaped active regions in adjacent rows is equal to a width of the strip-shaped active regions.

12. The method as claimed in claim 1, wherein a pitch of the strip-shaped active regions in each row is six times the shift distance.

13. The method as claimed in claim 1, wherein a pitch of the strip-shaped active regions in each row is eight to nine times a width of the strip-shaped active regions.

* * * * *